US012677514B2

(12) United States Patent
Im

(10) Patent No.: US 12,677,514 B2
(45) Date of Patent: Jul. 7, 2026

(54) DISPLAY DEVICE INCLUDING OPTICAL FILM HAVING MULTIPLE REGIONS

(71) Applicant: LG DISPLAY CO., LTD., Seoul (KR)

(72) Inventor: Heejin Im, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 380 days.

(21) Appl. No.: 18/218,853

(22) Filed: Jul. 6, 2023

(65) Prior Publication Data

US 2024/0213419 A1    Jun. 27, 2024

(30) Foreign Application Priority Data

Dec. 21, 2022    (KR) ........................ 10-2022-0180755

(51) Int. Cl.
H10H 20/855 (2025.01)
H10H 29/14 (2025.01)
H10W 90/00 (2026.01)

(52) U.S. Cl.
CPC ........ H10H 20/855 (2025.01); H10H 29/142 (2025.01); H10W 90/00 (2026.01)

(58) Field of Classification Search
CPC .. H10H 20/855; H10H 29/142; H10H 20/882; H01L 25/0753
See application file for complete search history.

(56) References Cited

U.S. PATENT DOCUMENTS

2013/0334559 A1* 12/2013 Vdovin .................. H10H 20/85
                                                        257/98
2020/0119237 A1* 4/2020 Kim .................. G02F 1/133617
2020/0350295 A1* 11/2020 Hu ........................ H10H 20/855
2021/0367113 A1* 11/2021 Lin ..................... H01L 25/0753

FOREIGN PATENT DOCUMENTS

KR    2008-0062127 A    7/2008
KR    2017-0026959 A    3/2017
TW         1701848 B  *  8/2020

OTHER PUBLICATIONS

Machine translation TW1701848 (Year: 2020).*

* cited by examiner

*Primary Examiner* — Tracie Y Green
(74) *Attorney, Agent, or Firm* — PnK IP LLC

(57) ABSTRACT

A display device comprising a substrate provided with a plurality of subpixels, a light-emitting diode formed in each of the plurality of subpixels on the substrate, and an optical film formed on the light-emitting diode above the entire surface of the substrate, wherein the optical film includes first and second regions having different materials.

20 Claims, 4 Drawing Sheets

DISPLAY DEVICE INCLUDING OPTICAL FILM HAVING MULTIPLE REGIONS

CROSS-REFERENCE TO RELATED APPLICATION

This application claims the priority of Korean Patent Application No. 10-2022-0180755 filed on Dec. 21, 2022, which is hereby incorporated by reference in its entirety.

BACKGROUND

Field of the Disclosure

The present disclosure relates to a display device, and more particularly, for example, without limitation, to a display device using a light-emitting diode.

Description of the Background

A display device is widely used as a display screen of a laptop computer, a tablet computer, a smart phone, a portable display device, and a portable information device display device (e.g., wearable device) in addition to a display screen of a television or a monitor. A liquid crystal display device and an organic light-emitting display device display an image by the use of thin film transistor serving as a switching element. The liquid crystal display device displays an image by the use of light irradiated from a backlight unit disposed under a liquid crystal display panel because the liquid crystal display device is not in a self-luminous manner. Since the liquid crystal display device has the backlight unit, there is a limitation in design, and luminance and response speed may be reduced. Since the organic light-emitting display device includes an organic material, the organic light-emitting display device is vulnerable to moisture, whereby reliability and lifespan thereof may be deteriorated.

Recently, research and development of a light-emitting diode display device using a micro light-emitting diode has been conducted, and the light-emitting diode display device has high quality and high reliability, whereby it is spotlighted as a next generation display device. Particularly, research is performed to realize a dual-view device through the micro light-emitting diode.

The description provided in the description of this section should not be assumed to be prior art merely because it is mentioned in or associated with the description of this section. The description of this section may include information that describes one or more aspects of the subject technology, and the description in this section does not limit the disclosure.

SUMMARY

Accordingly, the present disclosure is to provide a display device capable of realizing a dual view and improving a luminance.

In accordance with an aspect of the present disclosure, the above and other features may be accomplished by the provision of a display device comprising a substrate provided with a plurality of subpixels, a light-emitting diode formed in each of the plurality of subpixels on the substrate, and an optical film formed on the light-emitting diode above the entire surface of the substrate, wherein the optical film includes a first region and a second region, the first region and the second region including different materials.

Other details of the exemplary aspects are included in the detailed description and the drawings.

According to the present disclosure, it is possible to improve the uniformity of light distribution and the luminance of the display device while implementing a stable dual view.

It is to be understood that in addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other features and other advantages of the present disclosure will be more clearly understood from the following detailed description taken in conjunction with the accompanying drawings, in which:

FIG. 2 is a cross-sectional view illustrating a display device according to an exemplary aspect of the present disclosure; and FIG. 3 is a cross-sectional view illustrating a display device according to another exemplary aspect of the present disclosure.

Figure 1A:
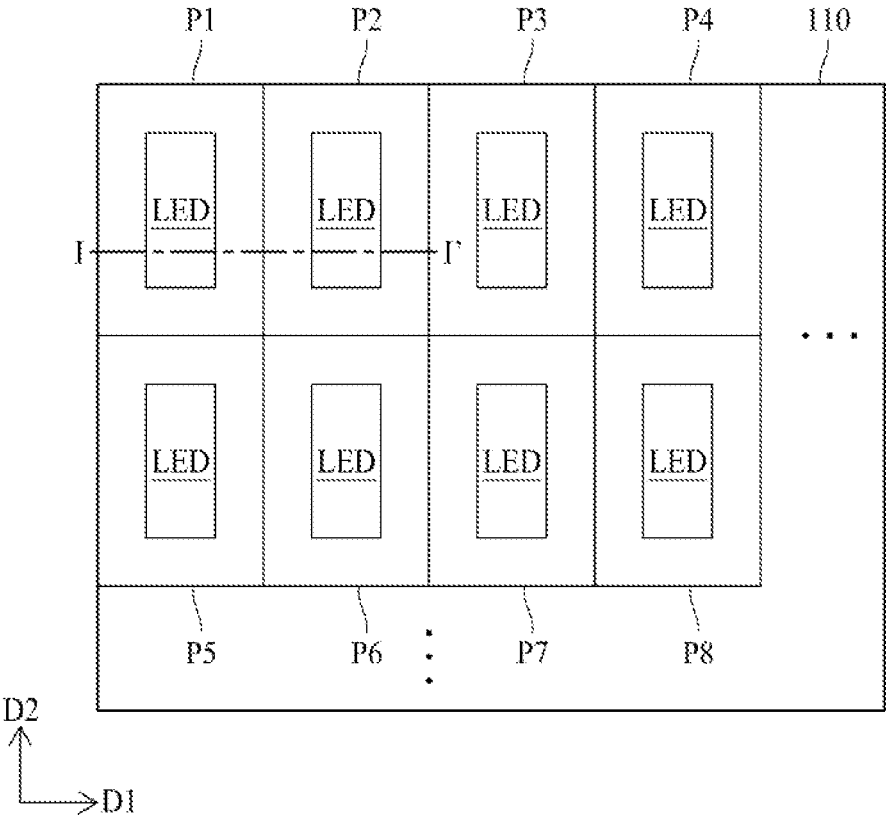
FIGS. 1A and 1B are a plan views illustrating a display device according to an exemplary aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims and their equivalents.

The shapes, sizes, areas, ratios, angles, and numbers disclosed in the drawings for describing the exemplary aspects of the present disclosure may be merely examples, and thus the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted or may be briefly provided.

In the case in which "comprise," "have," "contain," "constitute," "make up of," "formed of," "consist of," and "include" described in the present specification are used, another part may also be present unless the term such as "only" is used. The terms in a singular form may include plural forms unless noted to the contrary.

In the analysis of a component, it shall be understood that an error range or tolerance range is included therein, even in the situation in which there is no explicit description thereof.

In describing a positional relationship, for example, when the positional relationship between two parts is described using the terms such as "on," "over", "above," "below," "under," "beside," "beneath," "near," "close to," "adjacent to." "on a side of," "next to," or the like, one or more parts may be positioned between the two parts unless the terms are used with the term such as "immediately" "close(ly) or "directly".

When an element or layer is disposed "on" another element or layer, another layer or another element may be interposed directly on the other element or therebetween.

In describing a temporal relationship, for example, when temporally relative terms, such as "after," "subsequent," "following," "next," and "before," are used to define a temporal relationship, a non-continuous case may be included, unless a more limiting term such as "immediately", "just" or "directly" is used.

It will be understood that, although the terms "first," "second," "A", "B", "(a)", and "(b)" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In addition, terms, such as first, second, A, B, (a), and (b), may be used herein when describing components of the present disclosure. Each of these terminologies is not used to define an essence, order, or sequence of a corresponding component but used merely to distinguish the corresponding component from other components. In the case that it is described that a certain structural element or layer is "connected", "coupled", "adhered" or "joined" to another structural element or layer, it is typically interpreted that another structural element or layer may be "connected", "coupled", "adhered" or "joined" to the structural element or layer directly or indirectly.

A term "at least one" is typically understood as including any and all combinations of one or more of the associated components. For example, the meaning of "at least one of a first item, a second item, and a third item" denotes a combination of two or more components of the first component, the second component, and the third component as well as each individual component, the first component, the second component, or the third component.

A term "device" used herein may refer to a display device including a display panel and a driver for driving the display panel. Examples of the display device may include a light emitting diode (LED), and the like. In addition, examples of the device may include a notebook computer, a television, a computer monitor, an automotive device, wearable device, and an automotive equipment device, and a set electronic device (or apparatus) or a set device (or apparatus), for example, a mobile electronic device such as a smartphone or an electronic pad, which are complete products or final products respectively including LED and the like, but aspects of the present disclosure are not limited thereto.

A size and a thickness of each component illustrated in the drawing are illustrated for convenience of description, and the present disclosure is not limited to the size and the thickness of the component illustrated.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in a co-dependent relationship.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

Hereinafter, a display device according to the present disclosure will be described with reference to the accompanying drawings.

Figure 1B:
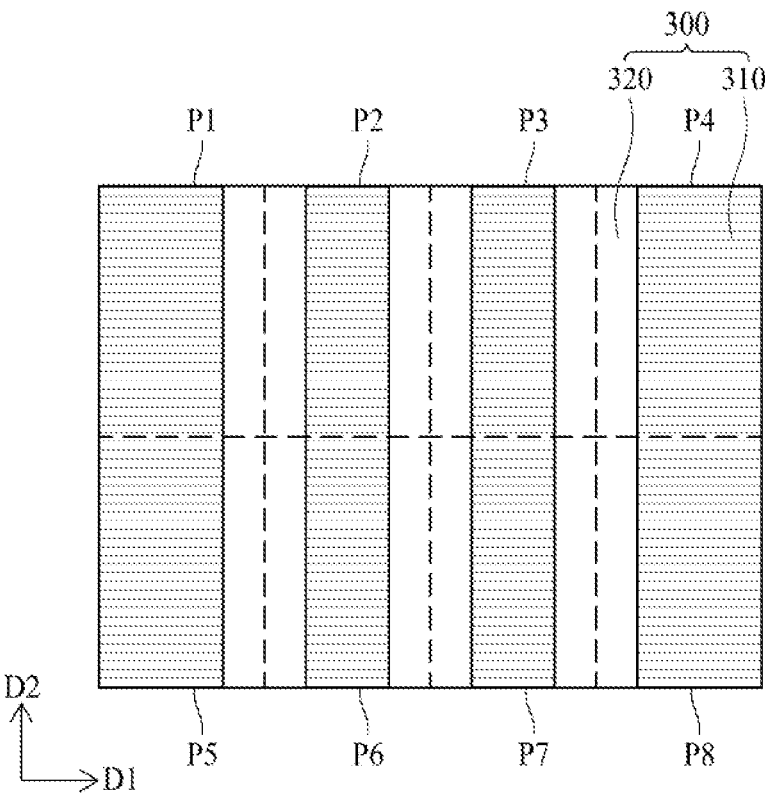

FIGS. 1A and 1B are a plan views illustrating a display device according to an exemplary aspect of the present disclosure. All the components of each display device according to all aspects of the present disclosure are operatively coupled and configured.

Referring to FIG. 1A, a substrate 110 may include a plurality of subpixels P1-P8. The plurality of subpixels P1-P8 may be formed in a matrix type along a first direction D1 and a second direction D2 perpendicular to the first direction D1. Each of the plurality of subpixels P1-P8 may include a light-emitting diode LED. The light-emitting diode LED is formed on the substrate 110 and is configured to emit light.

Referring to FIG. 1B, an optical film 300 may be formed on the light-emitting diode LED, and may cover the entire substrate 110. The optical film 300 may include first and second regions 310 and 320. The first and second regions 310 and 320 may be alternately formed along the first direction D1. In addition, each of the first and second regions 310 and 320 may have a shape extending along the second direction D2. The first region 310 may include a light-blocking material (for example, the first region 310 may include a black dye) and may be formed to overlap with the light-emitting diode LED. Also, the second region 320 may include a transparent insulating material (for example, Polyethylene terephthalate (PET), Polyethylene naphthalate (PEN), Poly(methyl methacrylate) (PMMA), Cyclo-olefin polymers (COP) or cyclo-olefin copolymers (COC)), and may be formed in a boundary region of the subpixel P. However, aspects of the present disclosure are not limited thereto.

Figure 2:
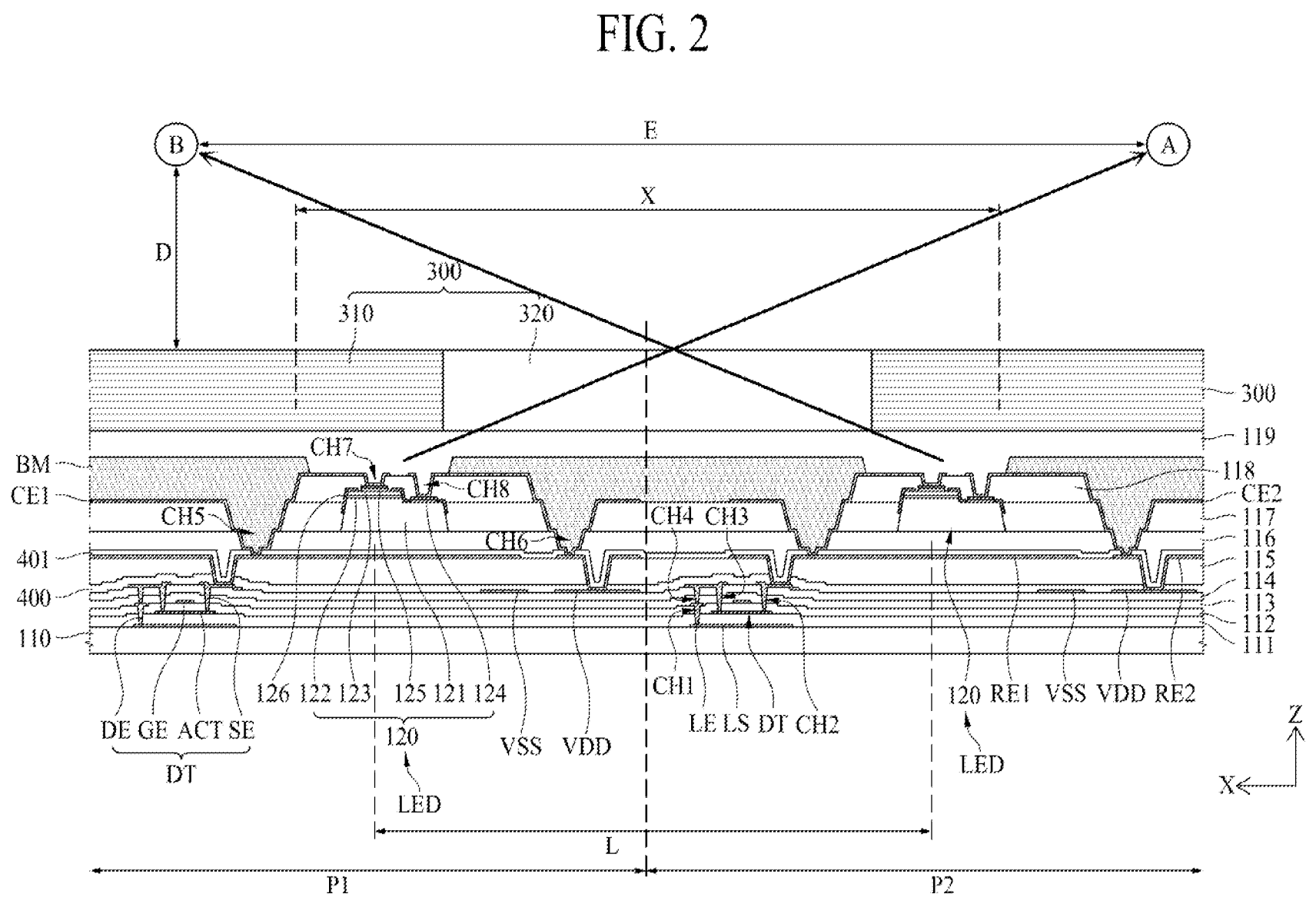

FIG. 2 is a cross sectional view illustrating the display device according to an exemplary aspect of the present disclosure. FIG. 2 illustrates the first and second subpixels P1 and P2 adjacent to each other.

Referring to FIG. 2, the display device includes the substrate 110, a buffer layer 111, a gate insulating layer 112, a first insulating interlayer 113, a second insulating interlayer 114, a third insulating interlayer 400, a first planarization layer 115, a fourth insulating interlayer 401, an adhesive layer 116, a second planarization layer 117, a third planarization layer 118, a fourth planarization layer 119, the optical film 300, a driving transistor DT, the light-emitting diode LED, a first reflective electrode RE1, a second reflective electrode RE2, a first connection electrode CE1, a second connection electrode CE2, a light shielding layer LS, an auxiliary electrode LE, and a bank BM, but not limited thereto.

The substrate 110 may be formed of glass, metal foils or plastic (e. g. Polymers such as PET or PEN), but not limited thereto. The display device according to an exemplary aspect of the present disclosure may be configured by a top emission type in which emitted light is emitted toward an upper portion, a bottom emission type, or a dual emission type. Therefore, a transparent material as well as an opaque material may be used as a material for the substrate 110 in top emission type display device. In the bottom emission type, the light emitted from the pixel array layer may be irradiated onto a rearward region behind the substrate to allow an image to be displayed, thus, a transparent material may be used as a material for the substrate 110.

The light shielding layer LS is formed on the substrate 110 and may be formed in each of the first and second subpixels P1 and P2. The light shielding layer LS may block light incident on the transistor from a lower portion of the substrate 110 to reduce or minimize leakage current. For example, the light shielding layer LS blocks light incident from a lower portion of the substrate 110 to an active layer ACT of the driving transistor DT, thereby reducing or minimizing a leakage current.

The buffer layer 111 may be formed on the substrate 110 and the light shielding layer LS. The buffer layer 111 may reduce penetration of moisture or impurities through the substrate 110. For example, the buffer layer 111 may be composed of a single layer or multiple layers of silicon oxide SiOx or silicon nitride SiNx, but not limited thereto. However, the buffer layer 111 may be omitted depending on the type of the substrate 110 or the type of transistor, but not limited thereto.

The driving transistor DT may be formed on the buffer layer 111. The driving transistor DT may include the active layer ACT, a gate electrode GE, a source electrode SE, and a drain electrode DE.

The active layer ACT may be formed on the buffer layer 111. The active layer ACT may be formed of a semiconductor material such as oxide semiconductor, amorphous silicon, and polysilicon, but not limited thereto. The active layer ACT may be a polycrystalline semiconductor. The polycrystalline semiconductor may be formed of a low temperature poly silicon (LTPS) having a high mobility, but is not limited thereto. For example, the active layer ACT may be formed of an oxide semiconductor or includes the oxide semiconductor, for example, the active layer ACT may be formed of one of indium gallium zinc oxide (IGZO), indium zinc oxide (IZO), indium gallium tin oxide (IGTO), and indium gallium oxide (IGO), but is not limited thereto. Alternatively, the active layer ACT may be formed of various organic semiconductors such as amorphous silicon (a-Si), polycrystalline silicon (poly-Si), or pentacene, etc., but is not limited thereto.

The gate insulating layer 112 may be formed on the active layer ACT. The gate insulating layer 112 is an insulating layer for insulating the active layer ACT and the gate electrode GE from each other, and may be composed of a single layer or multilayers of silicon oxide SiOx or silicon nitride SiNx, but not limited thereto.

The gate electrode GE may be formed on the gate insulating layer 112 and may be electrically connected to the scan line. The gate electrode GE may be formed of a conductive material, for example, copper Cu, aluminum Al, molybdenum Mo, nickel Ni, titanium Ti, chromium Cr, or an alloy thereof, but not limited thereto.

The first and second insulating interlayers 113 and 114 may be formed on the gate electrode GE. Through a contact hole formed in each of the first and second insulating interlayers 113 and 114, each of source electrode SE and the drain electrode DE may be electrically connected to the active layer ACT. The first and second insulating interlayers 113 and 114 are insulating layers for protecting configurations disposed below the first and second insulating interlayers 113 and 114 (for example, components disposed below the first and second insulating interlayers 113 and 114), and may be composed of a single layer or multilayers of silicon oxide SiOx or silicon nitride SiNx, but not limited thereto.

The source electrode SE and drain electrode DE electrically connected to the active layer ACT are disposed on the second insulating interlayer 114. The source electrode SE and the drain electrode DE may be formed of a conductive material, for example, copper Cu, aluminum Al, molybdenum Mo, nickel Ni, titanium Ti, chromium Cr, or an alloy thereof, but not limited thereto.

Meanwhile, as shown in FIG. 2, the first and second insulating interlayers 113 and 114, that is, a plurality of insulating layers are disposed between each of the gate electrode GE, the source electrode SE and the drain electrode DE, but only one insulating layer or N insulating layers (e.g., N is an integer more than 2) may be disposed between each of the gate electrode GE, the source electrode SE and the drain electrode DE, for example, the first insulating interlayers 113 or the second insulating interlayer 114 is disposed between each of the gate electrode GE, the source electrode SE and the drain electrode DE, or three or more insulating interlayers are disposed between each of the gate electrode GE, the source electrode SE and the drain electrode DE, but not limited thereto.

In particular, as shown in FIG. 2, when the plurality of insulating layers such as the first and second insulating interlayers 113 and 114 are disposed between each of the gate electrode GE, the source electrode SE and the drain electrode DE, an electrode may be additionally formed between the first and second insulating interlayers 113 and 114, and the additionally formed electrode may form a capacitor element different from that of element disposed below the first insulating interlayer 113 or disposed above the second insulating interlayer 114.

The auxiliary electrode LE may be formed on the gate insulating layer 112. The auxiliary electrode LE may electrically connect the light shielding layer LS to any one of the source electrode SE and the drain electrode DE. Accordingly, since the light shielding layer LS does not operate as a floating gate by the source electrode SE or the drain electrode DE, it is possible to reduce or minimize a change in a threshold voltage of the driving transistor DT caused by the floated light shielding layer LS. In FIG. 2, the light shielding layer LS is connected to the drain electrode DE through a first contact hole CHI passing through the buffer layer 111 and the gate insulating layer 112 and a fourth contact hole CH4 passing through the first and second insulating interlayers 113 and 114, however, the light shielding layer LS may also be connected to the source electrode SE, but not limited thereto.

The source electrode SE, the drain electrode DE, a first power line VDD, and a second power line VSS may be formed on the second insulating interlayer 114. The first power line VDD is electrically connected to the light-emitting diode LED together with the driving transistor DT, to thereby emit light of the light-emitting diode LED. The first power line VDD and the second power line VSS may be made of a conductive material, for example, copper Cu, aluminum Al, molybdenum Mo, nickel Ni, titanium Ti, chromium Cr, or an alloy thereof, but not limited thereto.

The third insulating interlayer 400 may be formed on the driving transistor DT, the first power line VDD, and the second power line VSS. The third insulating interlayer 400 is an insulating layer for protecting configurations disposed under the third insulating interlayer 400 (for example, components disposed under the third insulating interlayer 400), and may be composed of a single layer or multilayers of silicon oxide SiOx or silicon nitride SiNx, but not limited thereto.

The first planarization layer 115 may be formed on the third insulating interlayer 400. The first planarization layer 115 may planarize an upper portion of the substrate 110 on which the driving transistor DT is disposed. The first planarization layer 115 may be formed of a single layer or multilayers, and may be formed of, for example, a photoresist or acryl-based organic material, but not limited thereto.

The first and second reflective electrodes RE1 and RE2 may be formed on the first planarization layer 115 and may be arranged to be spaced apart from each other. The first and second reflective electrodes RE1 and RE2 electrically connect the light-emitting diode LED to the first power line VDD and the driving transistor DT and serve as a reflector for reflecting the light emitted from the light-emitting diode LED to the upper portion of the light-emitting diode LED. The first and second reflective electrodes RE1 and RE2 are formed of a conductive material having excellent reflection characteristics, and may reflect the light emitted from the light-emitting diode LED toward the upper portion of the light-emitting diode LED.

The first reflective electrode RE1 may electrically connect the driving transistor DT and the light-emitting diode LED. The first reflective electrode RE1 may be connected to the source electrode SE or the drain electrode DE of the driving transistor DT through a contact hole formed in the first planarization layer 115. The first reflective electrode RE1 may be electrically connected to the first electrode 124 and the first semiconductor layer 121 of the light-emitting diode LED through the first connection electrode CE1 to be described later, but not limited thereto.

The second reflective electrode RE2 may electrically connect the first power line VDD and the light-emitting diode LED. The second reflective electrode RE2 is connected to the first power line VDD through a sixth contact hole CH6 formed in the first planarization layer 115 and may be electrically connected to the second electrode 125 and the second semiconductor layer 123 of the light-emitting diode LED through the second connection electrode CE2 to be described later, but not limited thereto.

The fourth insulating interlayer 401 may be formed on the first and second reflective electrodes RE1 and RE2. The fourth insulating interlayer 401 is an insulating layer for protecting configurations disposed under the fourth insulating interlayer 401 (for example, components disposed under the fourth insulating interlayer 401), and may be composed of a single layer or multilayers of silicon oxide SiOx or silicon nitride SiNx, but not limited thereto.

An adhesive layer 116 may be formed on the fourth insulating interlayer 401. The adhesive layer 116 is coated on the entire surface of the substrate 110, to thereby fix the light-emitting diode LED disposed on the adhesive layer 116. For example, the adhesive layer 116 may be selected from any one or more of adhesive polymer, epoxy resist, UV resin, polyimide-based material, acrylate-based material, urethane-based material, or polydimethylsiloxane-based PDMS material, but not limited thereto.

The plurality of light-emitting diodes LEDs are formed on the adhesive layer 116, and may be formed in each of the first and second subpixels P1 and P2. The plurality of light-emitting diodes LEDs may include light-emitting diodes LED for emitting red light, green light, blue light, and the like, as elements for emitting light by a current, and may implement light of various colors including white by a combination thereof. For example, the plurality of light-emitting diodes LEDs may be light-emitting diodes LEDs or micro LEDs, but not limited thereto. The light-emitting diode LED may include a first semiconductor layer 121, a light-emitting layer 122, a second semiconductor layer 123, a first electrode 124, a second electrode 125, and an encapsulation film 126 or encapsulation layer 126.

The first semiconductor layer 121 is formed on the adhesive layer 116 and may provide holes to the light-emitting layer 122. The first semiconductor layer 121 may be formed of a p-GaN-based semiconductor material such as GaN, AlGaN, InGaN, and AlInGaN. Also, impurities used for doping of the first semiconductor layer 121 may be Mg, Zn, Be, or the like, but not limited thereto.

The light-emitting layer 122 is formed on the first semiconductor layer 121 and may be the light-emitting layer for emitting light. The light-emitting layer 122 may have a multi-quantum well MQW structure having a well layer and a barrier layer having a band gap higher than that of the well layer. For example, the light-emitting layer 122 may have a multi-quantum well structure of InGaN/GaN, but not limited thereto.

The second semiconductor layer 123 is formed on the light-emitting layer 122 and may provide electrons to the light-emitting layer 122. The second semiconductor layer 123 may be formed of an n-GaN-based semiconductor material such as GaN, AlGaN, InGaN, and AlInGaN. Also, impurities used for doping of the second semiconductor layer 123 may be Si, Ge, Se, Te, C, or the like, but not limited thereto.

The light-emitting diode LED is manufactured by sequentially stacking the first semiconductor layer 121, the light-emitting layer 122, and the second semiconductor layer 123, and then etching a predetermined portion thereof to form the first electrode 124 and the second electrode 125. The etched portion is provided to space the first electrode 124 and the second electrode 125 apart from each other, and a predetermined portion may be etched to expose a portion of the first semiconductor layer 121. That is, the first electrode 124 and the second electrode 125 may be formed at different heights.

Then, the encapsulation film 126 or encapsulation layer 126 (not shown) may be formed to surround the first semiconductor layer 121, the light-emitting layer 122, the second semiconductor layer 123, the first electrode 124, and the second electrode 125. The encapsulation film 126 or encapsulation layer 126 is made of an insulating material and is configured to protect the first semiconductor layer 121, the light-emitting layer 122, and the second semiconductor layer 123. A contact hole exposing the first electrode 124 and the second electrode 125 is formed in the encapsulation film 126 or encapsulation layer 126, whereby the first connection electrode CE1 and the second connection electrode CE2 may be electrically connected to the first electrode 124 and the second electrode 125. Each of the first and second electrodes 124 and 125 may comprise a metal material such as Au, W, Pt, Si, Ir, Ag, Cu, Ni, Ti, and Cr, or an alloy thereof. Alternatively, each of the first and second electrodes 124 and 125 may include a transparent conductive material such as ITO indium tin oxide and IZO indium zinc oxide.

The second and third planarization layers 117 and 118 may be formed on the plurality of light-emitting diodes LEDs. The second and third planarization layers 117 and 118 are arranged to cover the plurality of light-emitting diodes LEDs, to thereby fix and protect the plurality of light-emitting diodes LEDs. The second and third planarization layers 117 and 118 may be composed of a single layer or multiple layers, for example, photoresist or acryl-based organic material, but not limited thereto. Meanwhile, the present disclosure discloses that the second and third planarization layers 117 and 118 are disposed to cover the plurality of light-emitting diodes LEDs, but not necessarily. For example, the planarization layer covering the plurality of light-emitting diodes LEDs may be formed as a single layer or n-layers (e.g., n is a integer more than 2), but not limited thereto. In addition, the third planarization layer 118 may be located only in an area adjacent to the light-emitting diode LED.

After deposition of the third planarization layer 118, the first and second connection electrodes CE1 and CE2 may be formed.

The first connection electrode CE1 is disposed in each of the first and second subpixels P1 and P2 and is configured to electrically connect the light-emitting diode LED and the driving transistor DT to each other. The first connection electrode CE1 may be connected to the first reflective electrode RE1 through a contact hole passing through insulating layers, for example, the first connection electrode CE1 may be connected to the first reflective electrode RE1 through a contact hole formed in the third planarization layer 118, the second planarization layer 117, and the adhesive layer 116, but not limited thereto. Accordingly, the first connection electrode CE1 may be electrically connected to any one of the source electrode SE and the drain electrode DE of the driving transistor DT through the first reflective electrode RE1. The first connection electrode CE1 may be connected to an n-type electrode in each of the plurality of light-emitting diodes LEDs through a contact hole formed in the third planarization layer 118. Therefore, the first connection electrode CE1 may electrically connect the driving transistor DT to the n-type electrode and the n-type semiconductor layer of the plurality of light-emitting diodes LEDs.

The second connection electrode CE2 may electrically connect the light-emitting diode LED to the first power line VDD. The second connection electrode CE2 may be connected to the second reflective electrode RE2 through a contact hole passing through insulating layers, for example, the second connection electrode CE2 may be connected to the second reflective electrode RE2 through a contact hole formed in the third planarization layer 118, the second planarization layer 117, and the adhesive layer 116, but not limited thereto. Thus, the second connection electrode CE2 may be electrically connected to the first power line VDD through the second reflective electrode RE2. The second connection electrode CE2 may be connected to a p-type electrode in each of the plurality of light-emitting diodes LEDs through a contact hole formed in the third planarization layer 118. Therefore, the second connection electrode CE2 may electrically connect the first power line VDD to the p-type electrode and the p-type semiconductor layer of the plurality of light-emitting diodes LEDs.

The first connection electrode CE1 for connecting the driving transistor DT disposed in each of the first and second subpixels P1 and P2 to the light-emitting diode LED may be individually disposed in each of the first and second subpixels P1 and P2. The second connection electrodes CE2 disposed in each of the first and second subpixels P1 and P2 and configured to connect the first power line VDD and the light-emitting diode LED may be connected to each other. That is, since the power voltage of the first power line VDD is commonly applied to the plurality of light-emitting diodes LEDs of the first and second subpixels P1 and P2, a single second connection electrode CE2 may be disposed in the first and second subpixels P1 and P2.

The bank BM is formed on the third planarization layer 118 and is configured to define a light-emitting area. The bank BM may be formed of an inorganic insulating material or an organic insulating material. Also, the bank BM may be formed of an organic film such as acryl resin, epoxy resin, phenolic resin, polyamide resin, polyimide resin, and the like, and may include a black material for absorbing light, but not limited thereto.

The fourth planarization layer 119 may be formed on the bank BM and the light-emitting diode LED. The fourth planarization layer 119 is formed to cover the entire surface of the substrate 110, to thereby planarize the upper portion of the light-emitting diode LED. The fourth planarization layer 119 may be formed of an inorganic insulating material such as silicon oxide SiOx or silicon nitride SiNx. Alternatively, the fourth planarization layer 119 may include an organic insulating material such as acryl resin, epoxy resin, phenolic resin, polyamide resin, and polyimide resin, but not limited thereto. Alternatively, the fourth planarization layer 119 may be formed as more layers.

The optical film 300 is formed on the fourth planarization layer 119 and is configured to cover the entire substrate 110. The optical film 300 may include the first and second regions 310 and 320.

The first region 310 may include a light-blocking material. For example, the first region 310 may include a black dye. Also, the first region 310 may be overlapped with the light-emitting diode LED in each of the first and second subpixels P1 and P2.

In addition, the second region 320 may include a transparent insulating material. For example, the second region 320 may include an inorganic insulating material such as silicon oxide SiOx and silicon nitride SiNx. Alternatively, the second region 320 may include an organic insulating material such as acryl resin, epoxy resin, phenolic resin, polyamide resin, and polyimide resin, but not limited thereto. Also, the second region 320 may be formed between the adjacent first regions 310. That is, the second region 320 may be formed in the boundary area of the first and second subpixels P1 and P2.

As described above, since the first region 310 blocks light, an image of the display device may be displayed by the light transmitted through the second region 320. That is, through the second region 320, the light generated from the light-emitting diode LED may be emitted in the direction having an inclination relative to the upper surface of the optical film 300. For example, the light generated from the light-emitting diode LED of the first subpixel P1 may be emitted to a first viewing area A, and the light generated from the light-emitting diode LED of the second subpixel P2 may be emitted to a second viewing area B, but not limited thereto. That is, the first and second subpixels P1 and P2 may emit light in different directions.

In this case, when the first and second subpixels P1 and P2 display different images, the images displayed in the first and second viewing areas A and B may be different from each other. Therefore, since two or more images may be displayed on one display device, it is possible to provide a dual-view display device using the light-emitting diode LED according to the present disclosure.

In this case, when the distance from the center of the first region 310 formed in the first subpixel P1 to the center of the first region 310 formed in the second subpixel P2 is X, the value of X may follow Equation 1. In this case, 'L' may be the distance between the centers of the first and second subpixels P1 and P2, 'v' may be the number of images, and 'E' may be the distance between the first and second viewing areas A and B. According as FIG. 2 discloses a dual view, the value of 'v' may be 2, but not limited thereto, for example, the value of 'v' may also be ≥3. In addition, the width of the second region 320 may be about 0.5 times the X, but not limited thereto.

$$X = \frac{v}{\frac{1}{L} + \frac{1}{E}}$$ Equation 1

In addition, when the distance from the light-emitting diode LED to the upper surface of the optical film 300 is Y, the value of Y may follow Equation 2. Herein, 'n' may be a refractive index of the material constituting the fourth planarization layer 119, and 'D' may be the distance from the upper surface of the optical film 300 to the first viewing area A and the second viewing area B. For example, the value of 'n' may be 1.5, but not limited thereto.

$$Y = \frac{L \times n \times D}{E}$$ Equation 2

Figure 3:
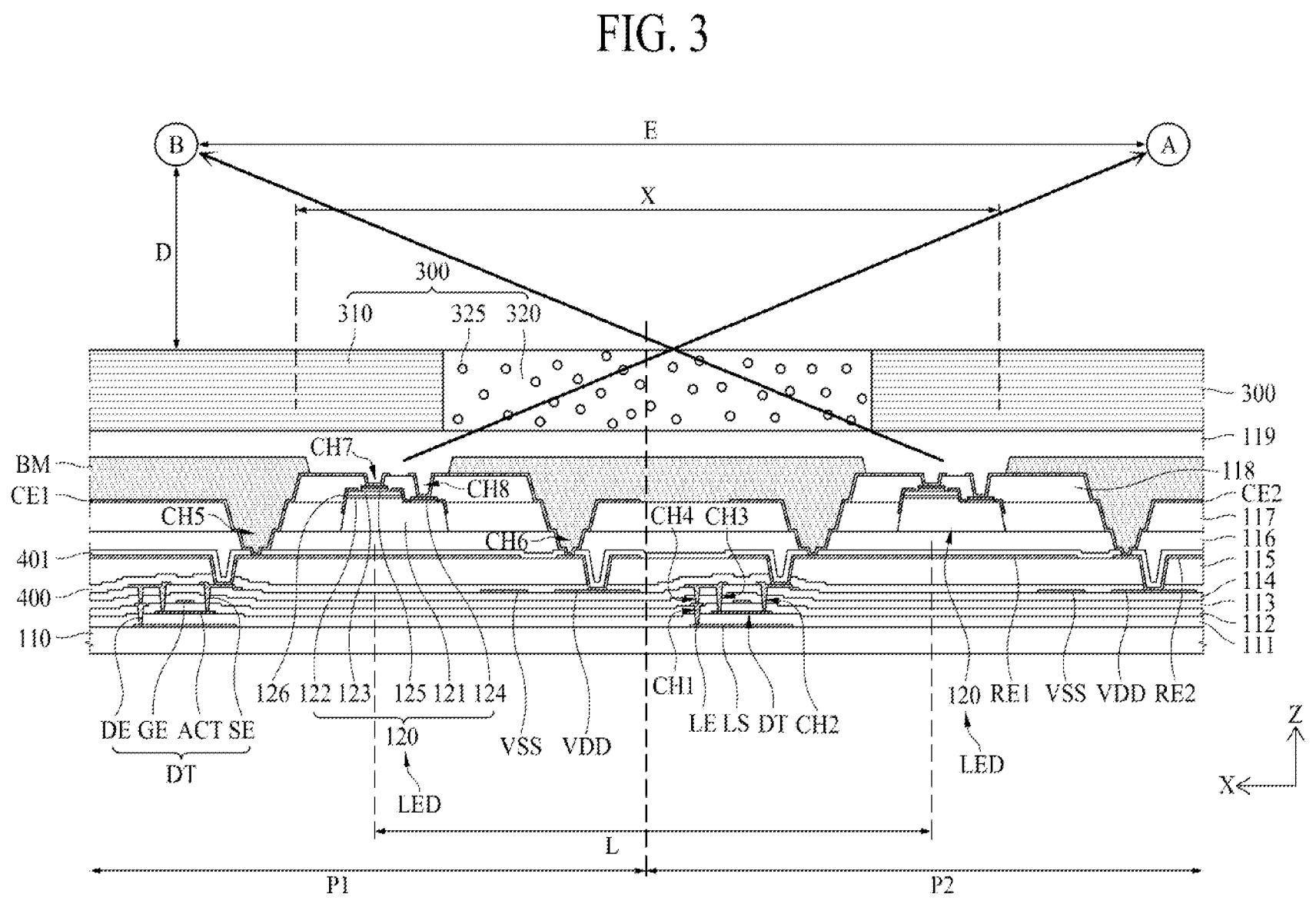

FIG. 3 is a cross sectional view of a display device according to another exemplary aspect of the present disclosure.

Compared with FIG. 2, FIG. 3 discloses substantially the same structure except for the structure of the optical film 300. Therefore, the same elements as those of the display device shown in FIG. 2 are denoted by the same reference numerals, and repeated descriptions thereof are omitted.

Referring to FIG. 3, the optical film 300 may include first and second regions 310 and 320.

As described above, the first region 310 may include a light-blocking material. For example, the first region 310 may include a black dye. Also, the first region 310 may be formed to overlap with the light-emitting diode LED in each of the first and second subpixels P1 and P2. In addition, the second region 320 may include a transparent insulating material. For example, the second region 320 may include an inorganic insulating material such as silicon oxide SiOx and silicon nitride SiNx. Alternatively, the second region 320 may include an organic insulating material such as acryl resin, epoxy resin, phenolic resin, polyamide resin, and polyimide resin, but not limited thereto. In addition, the second region 320 may be formed between the adjacent first regions 310. That is, the second region 320 may be formed in the boundary area of the first and second subpixels P1 and P2.

The second region 320 may further include a diffusion material 325. Accordingly, light passing through the second region 320 may be diffused. The diffusion material 325 may be in the form of bead made of resin such as polymethyl methacrylate PMMA, polybutyl methacrylate PBMA, polystyrene PS, and the like. The transmittance of the second region 320 may be 90% or more, but not limited thereto.

When a user watches an image at a position adjacent to the second region 320 than the first region 310, there is a possibility of a blurry image due to the overlapping of some of the light emitted from the first and second subpixels P1 and P2. However, the present disclosure may distribute light passing through the second region 320 since the diffusion material 325 is provided in the second region 320. Accordingly, it is possible to reduce the overlap of light emitted from the first and second subpixels P1 and P2. Therefore, the present disclosure may further improve the uniformity of light distribution and the luminance of the display device while implementing a stable dual view. According to the present disclosure, it is possible to realize the dual view and to improve the luminance of the display device by the optical film including the light-blocking material and the diffusion material.

The exemplary aspects of the present disclosure may also be described as follows:

According to an aspect of the present disclosure, there is provided a display device. The display device may comprise: a substrate provided with a plurality of subpixels; a light-emitting diode formed in each of the plurality of subpixels on the substrate; and an optical film formed on the substrate above the light-emitting diodes, wherein the optical film includes a first region and a second region, the first region and the second region including different materials.

A light generated from the light-emitting diode may be emitted in a direction having an inclination relative to an upper surface of the optical film.

The first region may include a light blocking material, and the second region includes a transparent insulating material.

The light blocking material may include a black dye.

The second region may further include a diffusion material.

The diffusion material may be in the form of bead made of resin.

The diffusion material may be in the form of bead made of one or more of polymethyl methacrylate PMMA, polybutyl methacrylate PBMA, polystyrene PS.

The plurality of subpixels may be arranged in a matrix type along a first direction and a second direction perpendicular to the first direction, the first and second regions may be alternately arranged in the first direction, and each of the first and second regions may extend in the second direction.

The plurality of subpixels may include first and second subpixels adjacent to each other in the first direction, the first region may overlap with the light-emitting diode formed in each of the first and second subpixels, and the second region may be formed in the boundary area of the first and second subpixels.

The light emitted from the first and second subpixels may be emitted in different directions.

The first and second subpixels may display different images.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device comprising:
a plurality of subpixels disposed on a substrate;
a light-emitting diode formed in each of the plurality of subpixels; and
an optical film disposed on the substrate and above the light-emitting diodes,
wherein the optical film includes a first region overlapping at least a portion of each of the light-emitting diodes, and a second region disposed between the light-emitting diodes, and

wherein the first region includes a light blocking material, and the second region includes a material different from the first region.

2. The display device according to claim 1, wherein the light-emitting diode emits light in a direction having an inclination with respect to an upper surface of the optical film.

3. The display device according to claim 1, wherein the second region includes a transparent insulating material.

4. The display device according to claim 3, wherein the light blocking material includes a black dye.

5. The display device according to claim 2, wherein the second region further includes a diffusion material.

6. The display device according to claim 5, wherein the diffusion material is in a form of bead made of resin.

7. The display device according to claim 6, wherein the bead is made of one or more of polymethyl methacrylate PMMA, polybutyl methacrylate PBMA, polystyrene PS.

8. The display device according to claim 2, wherein the plurality of subpixels are arranged in a matrix type along a first direction and a second direction perpendicular to the first direction, wherein the first and second regions are alternately arranged in the first direction, and each of the first and second regions extends in the second direction.

9. The display device according to claim 8, wherein the plurality of subpixels include first and second subpixels adjacent to each other in the first direction, the first region overlaps with the light-emitting diode formed in each of the first and second subpixels, and the second region is formed in a boundary area of the first and second subpixels.

10. The display device according to claim 9, wherein the first and second subpixels emit light in different directions.

11. The display device according to claim 9, wherein the first and second subpixels display different images.

12. A display device comprising:

a plurality of subpixels disposed on a substrate and arranged in a matrix type along a first direction and a second direction perpendicular to the first direction;

a light-emitting diode formed in each of the plurality of subpixels; and an optical film disposed on the substrate and above the light-emitting diodes,

14 wherein:

the optical film includes a first region and a second region alternately arranged in the first direction, extend in the second direction, and include different materials;

the light-emitting diode is configured to emit light in a direction having an inclination with respect to an upper surface of the optical film;

the plurality of subpixels include first and second subpixels adjacent to each other in the first direction;

the first region overlaps with the light-emitting diode formed in each of the first and second subpixels; and the second region is formed in a boundary area of the first and second subpixels.

13. The display device according to claim 12, wherein the first region includes a light blocking material, and the second region includes a transparent insulating material.

14. The display device according to claim 12, wherein the second region includes a diffusion material.

15. The display device according to claim 12, wherein the first and second subpixels are configured to emit light in different directions.

16. The display device according to claim 12, wherein the first and second subpixels are configured to display different images.

17. A display device comprising:

a plurality of subpixels disposed on a substrate;

a light-emitting diode formed in each of the plurality of subpixels; and an optical film disposed on the substrate and above the light-emitting diodes, wherein the optical film includes a first region overlapping at least a portion of each of the light-emitting diodes, and a second region disposed between the light-emitting diodes, and wherein the second region is configured to transmit a greater amount of light than the first region.

18. The display device according to claim 17, wherein the first region includes a light blocking material, and the second region includes a transparent insulating material.

19. The display device according to claim 17, wherein the second region includes a diffusion material.

20. The display device according to claim 12, wherein at least some of the subpixels are configured to display different images.

* * * * *